(12) United States Patent
Niederer et al.

(10) Patent No.: US 10,094,042 B2
(45) Date of Patent: Oct. 9, 2018

(54) METHOD OF SUPPORTING A GROWING SINGLE CRYSTAL DURING CRYSTALLIZATION OF THE SINGLE CRYSTAL ACCORDING TO THE FZ METHOD

(71) Applicant: SILTRONIC AG, Munich (DE)

(72) Inventors: Kurt Niederer, Eggenfelden (DE); Helmut Teroerde, St. Radegund (AT); Josef Berger, Reischach (DE); Goetz Meisterernst, Muehldorf (DE); Frank Muemmler, Emmerting (DE); Simon Zitzelsberger, Neuoetting (DE)

(73) Assignee: SILTRONIC AG, Munich (DE)

( * ) Notice: Subject to any disclaimer, the term of this patent is extended or adjusted under 35 U.S.C. 154(b) by 231 days.

(21) Appl. No.: 14/813,287

(22) Filed: Jul. 30, 2015

(65) Prior Publication Data

US 2016/0060786 A1    Mar. 3, 2016

(30) Foreign Application Priority Data

Sep. 3, 2014   (DE) ......................... 10 2014 217 605

(51) Int. Cl.
  *C30B 13/00*   (2006.01)
  *C30B 13/28*   (2006.01)
  *C30B 29/06*   (2006.01)
(52) U.S. Cl.
  CPC ............ *C30B 13/00* (2013.01); *C30B 13/285* (2013.01); *C30B 29/06* (2013.01)

(58) Field of Classification Search
  CPC combination set(s) only.
  See application file for complete search history.

(56) References Cited

U.S. PATENT DOCUMENTS

| | | | |
|---|---|---|---|
| 3,996,096 A | 12/1976 | Keller | |
| 4,045,183 A | 8/1977 | Barowski et al. | |
| 4,140,571 A | 2/1979 | Herzer et al. | |
| 5,126,113 A * | 6/1992 | Yamagishi | C30B 15/30 117/208 |

FOREIGN PATENT DOCUMENTS

| | | |
|---|---|---|
| DE | 24 55 173 | 6/1976 |
| DE | 26 52 199 | 5/1978 |
| EP | 0 288 639 A1 | 11/1988 |
| JP | 05194074 A | 8/1993 |

* cited by examiner

*Primary Examiner* — Erin F Bergner
(74) *Attorney, Agent, or Firm* — Brooks Kushman P.C.

(57) ABSTRACT

A growing single crystal is supported in the region of a conical section of the single crystal via a supporting body during crystallization of the single crystal by the FZ method. The method comprises pressing the supporting body against the conical section of the growing single crystal at a temperature at which a first material of the supporting body becomes soft, and continuing pressing the supporting body against the conical section of the growing single crystal until the first material and a second material of the supporting body that remains hard at the cited temperature touch the conical section of the growing single crystal.

10 Claims, 1 Drawing Sheet

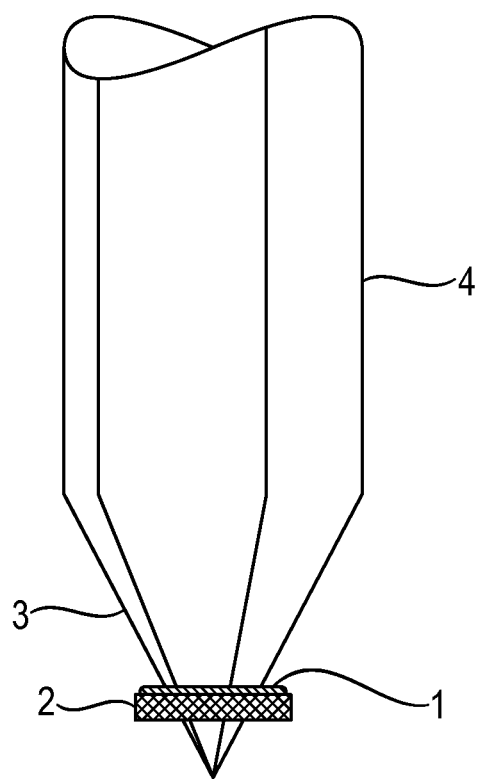

METHOD OF SUPPORTING A GROWING SINGLE CRYSTAL DURING CRYSTALLIZATION OF THE SINGLE CRYSTAL ACCORDING TO THE FZ METHOD

CROSS-REFERENCE TO RELATED APPLICATIONS

This application claims priority to German Patent Application No. DE 102014217605.0 filed Sep. 3, 2014 which is herein incorporated by reference.

BACKGROUND OF THE INVENTION

1. Field of the Invention

The invention provides a method of supporting a growing single crystal in the region of a conical section of the single crystal via a supporting body during crystallization of the single crystal according to the FZ method.

2. Description of the Related Art

Production of a single crystal according to the FZ method (floating zone method), also known as zone melting, comprises growing a single crystal in an upright orientation at a phase boundary disposed at the upper end of the growing single crystal between a melt and the growing single crystal. Lowering the single crystal causes material of the melt to crystallize thus increasing the volume of the single crystal. The loss of melt arising as a result is compensated for by gradually melting a solid feed, for example a feed rod. Also known are methods where granular material is melted instead of a feed rod.

The growing single crystal is obtained by contacting a comparatively thin seed crystal with molten material of the feed. A thin neck is initially generated to achieve dislocation-free crystal growth. On the thin neck, the single crystal grows initially to form a conical section of increasing diameter and subsequently to form a cylindrical section of constant diameter. To ensure the most uniform possible crystal growth and the most uniform possible distribution of dopants the growing single crystal is rotated about its longitudinal axis. If during rotation, the sense of rotation is periodically reversed according to a particular pattern, this is referred to as alternating rotation.

The surface tension keeps the melt in position at the upper end of the growing single crystal. The melt exhibits corresponding sensitivity to perturbations, in particular to vibration of the growing single crystal. It is imperative that vibration which causes spillover of the melt and/or results in termination of the crystal growth of the single crystal be avoided. The risk of this occurring increases with increasing diameter and weight of the single crystal to be produced.

Measures intended to protect the growing single crystal from such perturbations were already proposed early in the development of the FZ method. DE 2652199 describes a method that provides for application of a cylindrical length of glass tube as a supporting body against the conical section of the growing single crystal. That method is no longer sufficient for producing the single crystals of markedly greater weight that are now customary. The glass body is no longer entirely able to cope with the mechanical stress and may break apart due to the supporting forces being exerted upon it.

DE 2455173 proposes supporting the end of a crystal rod using a multipiece funnel sleeve filled with glass spheres as stabilizing means. Such an apparatus no longer fulfils the requirements either, as the apparatus cannot achieve sufficient bracing of the growing single crystal. However, such bracing is necessary to absorb the forces that arise during alternating rotation.

EP 0 288 639 A1 employs a ring of a hard ceramic material or of a hard metal to support the single crystal.

The inventors of the present invention have found that a hard ring too has disadvantages. Disposed upon the surface of a growing single crystal are crystal ridges. Crystal ridges are elevations extending in the direction of growth of the single crystal which protrude from the lateral surface of the conical section and/or from the lateral surface of the cylindrical section of the growing single crystal. Application of the hard ring to the growing single crystal causes reaction forces to be transmitted to the hard ring particularly via the protruding crystal ridges. This can exert so much pressure onto the crystal ridges that the ridges collapse at the affected areas. The shock that follows this collapse and acts on the growing single crystal is a perturbation which causes the melt to vibrate and can cause spillover thereof.

SUMMARY OF THE INVENTION

It is accordingly an object of the present invention to propose a method of supporting a growing single crystal that meets even the requirements that need to be met to be able to produce large and heavy single crystals in high yield. These and other objects are achieved by a method of supporting a growing single crystal in the region of a conical section of the single crystal via a supporting body during crystallization of the single crystal according to the FZ method, comprising pressing a supporting body against the conical section of the growing single crystal at a temperature at which a first material of the supporting body becomes soft, and continuing pressing of the supporting body against the conical section of the single crystal until the first material and a second material of the supporting body that remains hard at the cited temperature touch the conical section of the growing single crystal.

BRIEF DESCRIPTION OF THE DRAWINGS

FIG. 1 illustrates one embodiment of a supporting body of the present invention.

DETAILED DESCRIPTION OF THE PREFERRED EMBODIMENT(S)

By use of the inventive supporting body, reaction forces are transmitted to the supporting body for supporting the growing single crystal in a fashion where the forces are distributed over a comparatively large area. Collapsing of crystal ridges and consequent damage caused by this collapsing no longer occurs. The arrangement of the growing single crystal and the supporting body also readily withstands forces acting upon it as a result of alternating rotation of the growing single crystal.

The first material of the supporting body is preferably glass, more preferably borosilicate glass. The second material of the supporting body is preferably a metal, more preferably steel, or a ceramic material, particular preference being given to silicon nitride.

According to a particularly preferred embodiment of the invention, the supporting body comprises an outer cylindrical ring made of the second material and an inner cylindrical ring made of the first material.

FIG. 1 shows a side view of an inventive arrangement of this supporting body and a single crystal. The inner cylindrical ring 1 is embedded in the outer cylindrical ring 2 such that the outer lateral surface of the inner cylindrical ring abuts the inner lateral surface of the outer cylindrical ring. The supporting body is pressed against the conical section 3 of the growing single crystal 4 until an interspace between an inner lateral surface of the outer ring and the growing single crystal is occupied by the first material and crystal ridges of the single crystal contact the inner lateral surface of the outer ring.

When the outer cylindrical ring is made of metal, the metal is preferably steel or a metal having a hardness not less than the hardness of steel. When the outer cylindrical ring is made of ceramic material the ceramic material is preferably silicon nitride or a ceramic material having a hardness not less than the hardness of silicon nitride. The glass of which the inner cylindrical ring is made is preferably an inorganic oxidic glass, more preferably borosilicate glass, in particular borosilicate glass 3.3 marketed by SCHOTT under the registered trademark DURAN®. The glass transition temperature of the glass is preferably not more than 520-550° C.

The thickness of the mantle between the inner lateral surface and the outer lateral surface of the inner cylindrical ring is preferably not less than 2 mm and not more than 10 mm. The height of the mantle of the inner cylindrical ring is preferably not less than 2 mm and not more than 10 mm.

The supporting body is pressed against the conical section of the growing single crystal at a point in time where the conical section has a temperature at which the cylindrical ring of glass becomes soft and viscous. This causes crystal ridges to penetrate the glass until they contact the inner lateral surface of the outer ring while glass fills the interspace between the growing single crystal and the inner lateral surface of the outer ring. In the further course of crystal growth the temperature of the conical section falls with increasing distance of the conical section of the single crystal to the phase boundary and the glass therefore solidifies.

In this situation reactive forces are transmitted to the supporting body for supporting the growing single crystal in a fashion where said forces are distributed over a comparatively large area. Collapsing of crystal ridges and consequent damage caused by the collapsing no longer occurs. This arrangement of the growing single crystal and the supporting body for supporting the growing single crystal also readily withstands forces acting upon it as a result of alternating rotation of the growing single crystal.

It is preferable that the supporting body is floatingly mounted on a base when the body is pressed against the conical section of the growing single crystal. This makes it possible to compensate for diameter variations more effectively. Such a mounting is described in DE 2652199. The supporting body may be pressed against the conical section using, for example, an apparatus which operates in a similar fashion to an apparatus proceeding from DE 2652199 or EP 0 288 639 A1.

The method according to the invention is preferably used for supporting growing single crystals of semiconductor material, more preferably for supporting growing single crystals of silicon. The diameter of the single crystals in the cylindrical section may be 200 mm or more and the weight of the grown single crystal may be 20 kg or more.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method of supporting a growing single crystal in the region of a conical section of the single crystal via a supporting body during crystallization of the single crystal as prepared by the FZ method, comprising pressing a supporting body against the conical section of the growing single crystal at a temperature at which a first material of the supporting body becomes soft, and continuing pressing the supporting body against the conical section of the growing single crystal until the first material and a second material of the supporting body that remains hard at the cited temperature touch the conical section of the growing single crystal.

2. The method of claim 1, wherein the first material is glass.

3. The method of claim 1, wherein the first material is borosilicate glass.

4. The method of claim 1, wherein the second material comprises a metal or a ceramic material.

5. The method of claim 2, wherein the second material comprises a metal or a ceramic material.

6. The method of claim 3, wherein the second material comprises a metal or a ceramic material.

7. The method of claim 1, wherein the second material comprises steel or silicon nitride.

8. The method of claim 1, wherein the second material comprises steel.

9. The method of claim 1, wherein the second material comprises silicon nitride.

10. The method of claim 1, wherein the supporting body comprises an outer cylindrical ring of the second material and an inner cylindrical ring of the first material, and the supporting body is pressed against the conical section of the growing single crystal until an interspace between an inner lateral surface of the outer ring and the growing single crystal is occupied by the first material and crystal ridges of the single crystal contact the inner lateral surface of the outer ring.

* * * * *